US011402416B2

(12) United States Patent
Kraus et al.

(10) Patent No.: US 11,402,416 B2
(45) Date of Patent: Aug. 2, 2022

(54) DETECTING UTILITY METER ORIENTATION BASED ON A TEMPERATURE GRADIENT OF THE UTILITY METER

(71) Applicant: Landis+Gyr Innovations, Inc., Alpharetta, GA (US)

(72) Inventors: Matthew E. Kraus, Jamestown, IN (US); Frank J. Boudreau, Jr., Otterbein, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 0 days.

(21) Appl. No.: 16/925,927

(22) Filed: Jul. 10, 2020

(65) Prior Publication Data

US 2022/0011353 A1 Jan. 13, 2022

(51) Int. Cl.
*G01R 22/06* (2006.01)
*G01D 4/00* (2006.01)
*G01F 1/684* (2006.01)
*G06Q 50/06* (2012.01)

(52) U.S. Cl.
CPC ........... *G01R 22/063* (2013.01); *G01D 4/004* (2013.01); *G01F 1/684* (2013.01); *G06Q 50/06* (2013.01)

(58) Field of Classification Search
CPC .................................................. G01R 22/063
USPC ........................................................ 702/62
See application file for complete search history.

(56) References Cited

U.S. PATENT DOCUMENTS

| 2004/0031331 | A1  | 2/2004  | Blakley et al. |             |
|--------------|-----|---------|----------------|-------------|
| 2007/0103334 | A1* | 5/2007  | Soni           | G01D 4/002  |
|              |     |         |                | 340/870.02  |
| 2010/0036625 | A1* | 2/2010  | Martin         | G01K 1/14   |
|              |     |         |                | 702/62      |
| 2012/0299745 | A1* | 11/2012 | LaFrance       | G01D 4/004  |
|              |     |         |                | 340/870.02  |
| 2014/0100808 | A1* | 4/2014  | Komati         | G01D 3/0365 |
|              |     |         |                | 702/85      |
| 2016/0131688 | A1* | 5/2016  | Carlson        | G01R 22/10  |
|              |     |         |                | 702/61      |

(Continued)

FOREIGN PATENT DOCUMENTS

DE  102007014810  4/2008

OTHER PUBLICATIONS

International Patent Application No. PCT/US2021/040521, International Search Report and Written Opinion dated Oct. 15, 2021, 15 pages.

*Primary Examiner* — Ricky Go
(74) *Attorney, Agent, or Firm* — Kilpatrick Townsend & Stockton LLP

(57) ABSTRACT

Techniques described herein detect a meter orientation based on a temperature gradient measured for a utility meter. A method for detecting a meter orientation includes determining a set of temperature measurements including a respective temperature measurement at two or more temperature sensors of a utility meter. The method further includes comparing the set of temperature measurements to a thermal fingerprint of the utility meter. The thermal fingerprint represents a baseline set of one or more temperature gradients based on the two or more temperature sensors over time. The method further includes detecting a meter orientation based on comparing the set of temperature measurements to the thermal fingerprint of the utility meter.

20 Claims, 10 Drawing Sheets

(56) References Cited

U.S. PATENT DOCUMENTS

2016/0223374 A1    8/2016  Buckl et al.
2017/0131117 A1*  5/2017  Torpy ........................ H02H 5/04

* cited by examiner

DETECTING UTILITY METER ORIENTATION BASED ON A TEMPERATURE GRADIENT OF THE UTILITY METER

TECHNICAL FIELD

Implementations described herein relate to utility meters and, more particularly, to determining an orientation of a utility meter based on a temperature gradient of the utility meter.

BACKGROUND

Generally, a utility meter measures the consumption of a resource, where that consumption occurs on a premises associated with the utility meter. The utility meter provides consumption data, describing that consumption, to a utility service provider to enable the utility service provider to bill a user for the resource. To determine power consumption, for instance, a utility meter that is an electricity meter measures the power flowing from a power distribution network through the electricity meter. Based on such measurements, an electricity service provider can determine how much to bill a user for the electricity usage.

In some cases, to lower a utility bill, a user might tamper with the utility meter, specifically by turning the utility meter upside-down, which switches the direction in the flow of the resource detected by the meter. For instance, in the case of turning an electricity meter upside-down, the flow of power is then from the premises to the power distribution network through the electricity meter. This simulates a circumstance in which the user is generating power, as might be the case if the user were using solar panels. As a result, the service provider does not charge the user for the electricity usage. This enables the user to reduce the associated utility bill.

Some mechanisms exist for determining whether a utility meter is upside-down, thus enabling a service provider to ameliorate the situation. For instance, the utility meter may be manufactured to include a gyroscope, an accelerometer, a magnetometer, or a tilt switch. These specialized devices detect properties of the utility meter, such as the direction of gravity relative to the meter, that indicate an orientation of the utility meter. Alternatively, when a utility meter is taking readings indicating an inward flow of the resource, the service provider can dispatch a technician to determine whether the utility meter is upside-down.

SUMMARY

In one implementation, a method for detecting a meter orientation includes determining a set of temperature measurements including a respective temperature measurement at two or more temperature sensors of a utility meter. The method further includes comparing the set of temperature measurements to a thermal fingerprint of the utility meter. The thermal fingerprint represents a baseline set of one or more temperature gradients based on the two or more temperature sensors over time. The method further includes detecting a meter orientation based on comparing the set of temperature measurements to the thermal fingerprint of the utility meter.

In another implementation, a detection system includes two or more temperature sensors, a temperature aggregator, and an orientation detector. The two or more temperature sensors are incorporated into a utility meter and are configured to determine a set of temperature measurements at the utility meter. The temperature aggregator is configured to combine the set of temperature measurements into a temperature gradient. The orientation detector is configured to compare the temperature gradient to a thermal fingerprint of the utility meter to detect a meter orientation of the utility meter. The thermal fingerprint represents a baseline set of one or more temperature gradients based on the two or more temperature sensors over time.

In yet another implementation, a computer-program product for detecting a meter orientation includes a computer-readable storage medium having program instructions embodied thereon. The program instructions are executable by one or more processors to cause the one or more processors to perform a method. The method includes determining a set of temperature measurements including a respective temperature measurement at two or more temperature sensors of a utility meter. The method further includes comparing the set of temperature measurements to a thermal fingerprint of the utility meter. The thermal fingerprint represents a baseline set of one or more temperature gradients based on the two or more temperature sensors over time. The method further includes detecting a meter orientation based on comparing the set of temperature measurements to the thermal fingerprint of the utility meter.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Existing mechanisms for determining whether a utility meter is upside-down have various drawbacks. For instance, in the case of including certain specialized hardware in the utility meter to detect meter orientation (i.e., orientation of a utility meter), the cost of that hardware causes the utility meter to be more expensive to produce. Alternatively, having a technician check the orientation of the utility meter requires human intervention and is costly in terms of time and manual work.

According to some implementations described herein, a utility meter is capable of measuring its own temperature and of using the temperature measurement (i.e., the temperature as measured) to determine its orientation. Specifically, an example of the utility meter measures its temperature at two or more internal points, using existing subsystems of the utility meter or using additional sensors such as transistors. Based on the set of temperature measurements corresponding to points on the utility meter, as compared to a thermal fingerprint of the meter in a right-side up position (i.e., upright), a detection system described herein can determine whether the utility meter is in an incorrect orientation, such as upside-down (i.e., inverted).

In some implementations, a utility meter determines its temperature at two or more positions according to temperature measurements taken by existing subsystems or based on transistors installed in the utility meter. Because the existing subsystems are included in the utility meter regardless of whether they are used to determine orientation, the use of such existing subsystems for determining orientation does not add significant cost to manufacturing the utility meter. Further, because transistors are inexpensive, the use of transistors for determining temperature also does not add significant cost to the manufacture of the utility meter. Thus, some implementations enable a service provider to determine whether the utility is in an incorrect orientation, using a technique that is cost effective and does not require human intervention.

Figure 1:
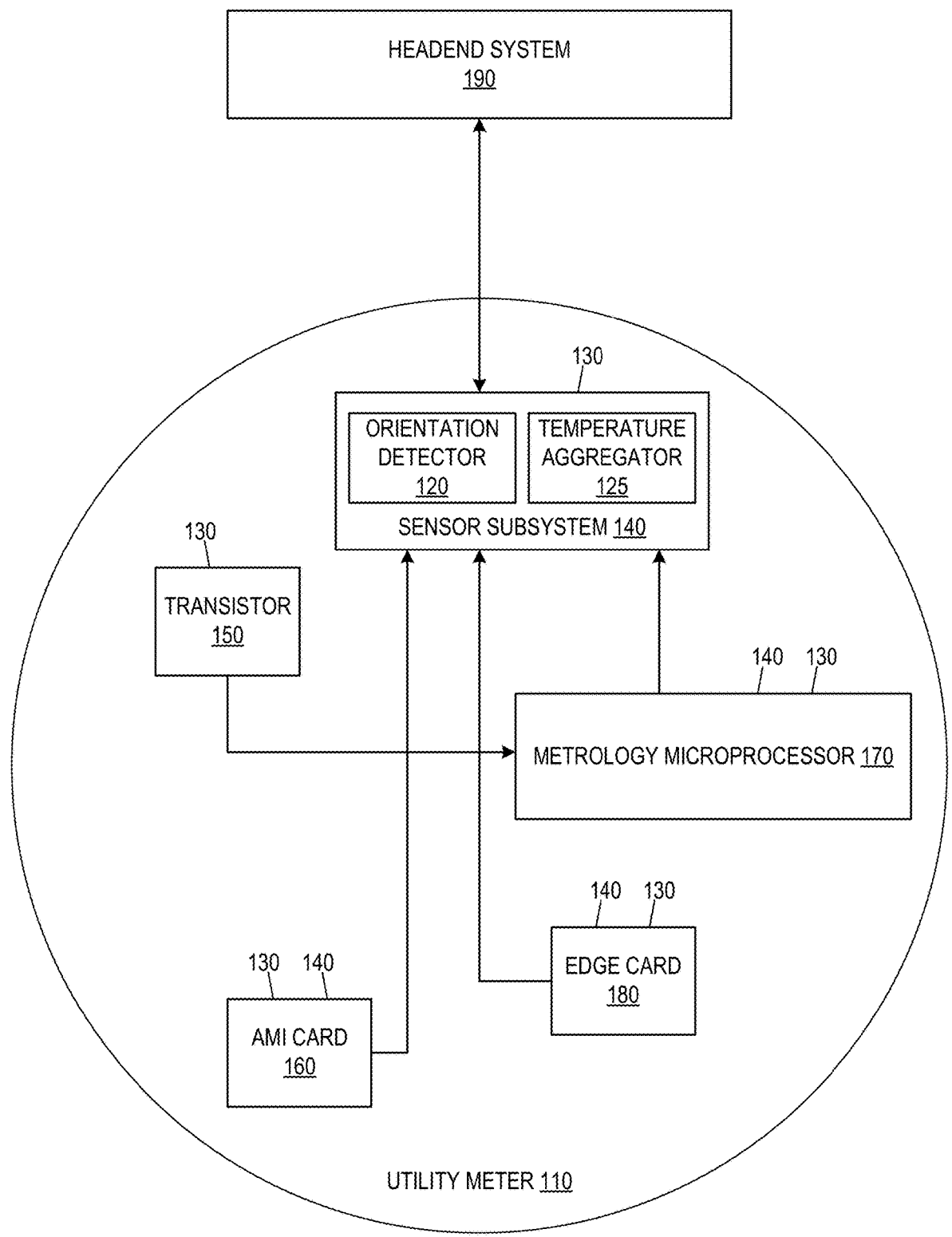
FIG. 1 is a diagram of a detection system for determining an orientation of a utility meter, according to some implementations described herein.

FIG. 1 is a diagram of a detection system 100 for determining an orientation of a utility meter 110, according to some implementations described herein. Specifically, an implementation of the detection system 100 determines whether the orientation of the utility meter 110 is incorrect such as by being upside-down. As shown in FIG. 1, the utility meter, also referred to as a meter 110, includes an orientation detector 120, a temperature aggregator 125, and one or more temperature sensors 130 capable of providing an indication of temperature. In some implementations, the orientation detector 120 aggregates temperature measurements from the temperature sensors to enable determination of meter orientation based on such temperatures. Each temperature sensor 130 of the detection system 100 is either a sensor subsystem 140 of the meter 110 or some other sensor, such as a transistor 150. Each temperature sensor 130 detects (i.e., measures) temperature at a respective point of the meter 110, and the various temperature sensors 130 may be distributed throughout the meter 110 in a manner that enables the detection system 100 to detect temperature at various points of the meter 110 so as to determine a temperature gradient across the meter 110.

A sensor subsystem 140 is a subsystem of the utility meter 110 that performs a function other than on behalf of the detection system and includes an internal temperature-sensing capability. For instance, sensor subsystems 140 that detect temperature include one or more the following: an Advanced Metering Infrastructure (AMI) card 160, a metrology microprocessor 170, an edge card 180, or other components of the meter 110. Each of the AMI card 160, the metrology microprocessor 170, the edge card 180, or other sensor subsystem 140 may be a respective hardware device, potentially also including firmware or software. Generally, the AMI card 160 may enable the meter 110 to perform automated functions as part of an infrastructure of smart meters connected over a communication network. Such automated functions could include, for instance, detecting tampering, connecting, or disconnecting service, or monitoring voltages. The metrology microprocessor 170 may perform metering functions, such as measuring the consumption of a resource. The edge card 180 may enable edge computing, such as by providing data processing and analysis at the meter 110; for instance, the edge card 180 may be a single board computer. Each of the AMI card 160, the metrology microprocessor 170, and the edge card 180, or other sensor subsystem 140 may typically include an internal temperature-sensing capability, such as to prevent overheating or to detect a hot socket condition. Some implementations described herein utilize that internal temperature sensing-capability to determine an orientation of the meter 110. Thus, each of the AMI card 160, the metrology microprocessor 170, the edge card, or other sensor subsystem 140 can perform its typical duties in addition to contributing to the determination of meter orientation.

In some implementations, a transistor 150 can operate as a temperature sensor 130 that contributes to the determination of meter orientation. The base of each transistor 150 provides an indication of temperature, where that indication can be current, voltage, or resistance, for instance. The indication at the transistor's base can be detected and translated into a temperature. In some implementations, as in the example shown in FIG. 1, a sensor subsystem 140, which also measures its own temperature, can detect the indication at the base of the transistor 150 and translate that indication into a temperature. In some implementations, the indication provided by the transistor 150 is correlated with temperature. In other words, for a transistor 150, there is a correlation between current and temperature, voltage and temperature, or resistance and temperature, and the sensor subsystem 140 or other component detecting the indication from the transistor 150 determines the temperature at the transistor 150 based on this correlation.

More specifically, in some implementations, a sensor subsystem 140 or other component coupled to the transistor 150 detects from the transistor 150 an indication of temperature, such as current, voltage, or resistance. To this end, the sensor subsystem 140 or other component may include an analog-to-digital (A/D) converter, which receives the current, voltage, resistance or other indication as input from the transistor 150 and converts that indication into digital data, which the sensor subsystem 140 or other component translates into a temperature measurement based on a known correlation. Additionally or alternatively, an A/D converter outside of the sensor subsystem 140 or other component receives the indication from the transistor 150 and outputs a digital signal representing the indication, such that the digital signal is received by the sensor subsystem 140 or other component, which translates the digital signal into a temperature measurement. It will be understood that various implementations are possible and are within the scope of this disclosure.

Using the temperature sensors, an implementation of the meter 110 detects its temperature at one or more points, or locations, throughout the meter 110; for instance, the number of points at which temperature is detected can equal the number of temperature sensors 130 in use by the detection system 100. Generally, at a given time, a utility meter 110 does not have the same temperature throughout. For instance, testing has revealed that utility meters tend to run hotter toward the top and cooler toward the bottom. Additionally, the utility meter 110 includes various internal devices, each of which may impact temperate. For instance, a power supply of a utility meter 110 tends to be relatively hot compared to other areas in the meter 110 and tends to dissipate heat, making nearby areas in the meter 110 hot as well. Thus, at a given time, the respective temperature readings of the various temperature sensors 130 may vary due to a variance of temperature across the meter 110.

As mentioned above and as will be described in detail below, the temperature aggregator 125 aggregates the temperature measurements of the various temperature sensors 130. The temperature aggregator 125 may store the temperature measurements as temperature data in which each temperature measurement is associated with its source (e.g., with the temperature sensor 130 that took the temperature measurement). Specifically, for instance, an implementation of the temperature aggregator 155 generates a temperature gradient, which may be a vector or set of coordinates that encapsulates the temperature measurements from the various temperature sensors 130, where each such temperature gradient is associated with a time at which the temperature measurements occurred. In some implementations, the orientation detector 120 analyzes the temperature data to determine whether the meter orientation is incorrect, specifically, whether the meter is upside-down. Each of the temperature aggregator 125 and the orientation detector 120 may include hardware, software, or a combination of both. For instance, each of the temperature aggregator 125 and the orientation detector 120 may be embodied in one or more software functions or may be implemented as a specialized hardware device. In some implementations, either or both of the temperature aggregator 125 and the orientation detector 120 are integrated with the AMI card 160, the metrology microprocessor 170, the edge card 180, some other sensor subsystem 140, or some other component of the meter 110. Although FIG. 1, illustrates an example in which the temperature aggregator 125 and the orientation detector 120 are in a single sensor subsystem 140, this need not be the case; rather, the temperature aggregator 125 and the orientation detector 120 may be integrated with different sensor subsystems 140 or other components of the meter 110.

In some implementations, the meter 110 is in communication with a headend system 190, which acts as a centralized processor for certain tasks of various utility meters. If the orientation detector 120 determines that the meter orientation is incorrect, then the meter 110 may transmit a notification of incorrect meter orientation to the headend system 190. As such, the utility service provider can be notified of the incorrect meter orientation by way of the headend system 190.

Figure 2:
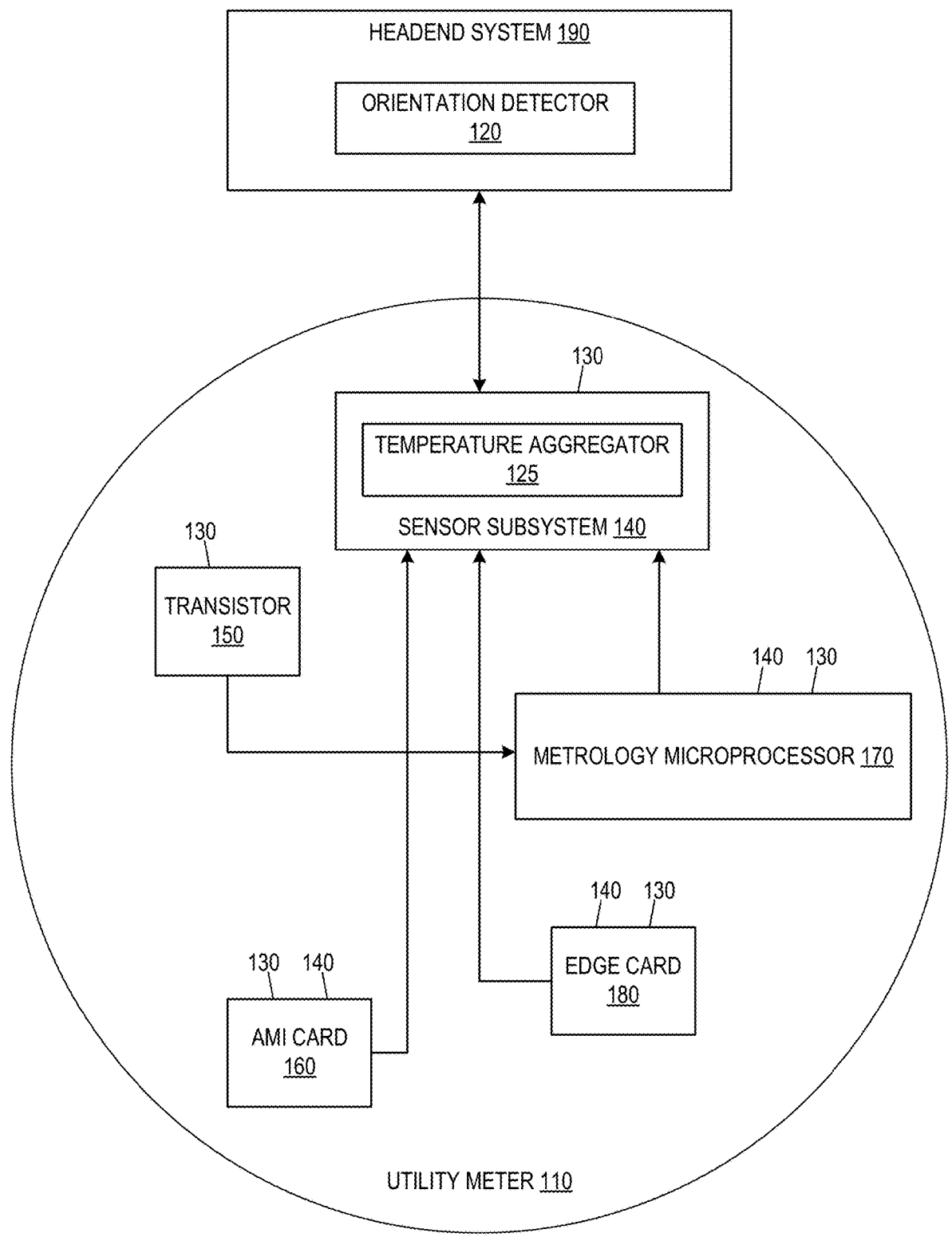
FIG. 2 is another diagram of a detection system for determining the orientation of a utility meter, according to some implementations described herein.

FIG. 2 is another diagram of the detection system 100 for determining the orientation of a utility meter 110, according to some implementations described herein. In the example of FIG. 2, the orientation detector 120 is located remotely from the utility meter 110. Specifically, for instance, the orientation detector 120 may reside in the headend system 190 as shown; in other words, the headend system 190 may perform the tasks of determining meter orientation based on the temperature data measured at the meter 110. In that case, the headend system 190 may act as a centralized processor that determines the orientation of various utility meters 110 that implement aspects described herein.

In some implementations, as in the example of FIG. 2, the temperature aggregator 125 determines temperature data by aggregating temperature measurements from the various temperature sensors 130. The utility meter 110 transmits the temperature data to the orientation detector 120 at the headend system 190. The orientation detector 120 may then determine the meter orientation based on the temperature data. If the orientation detector 120 determines that meter orientation is incorrect, the headend system 190 may generate an alert for the utility service provider.

Figure 3:
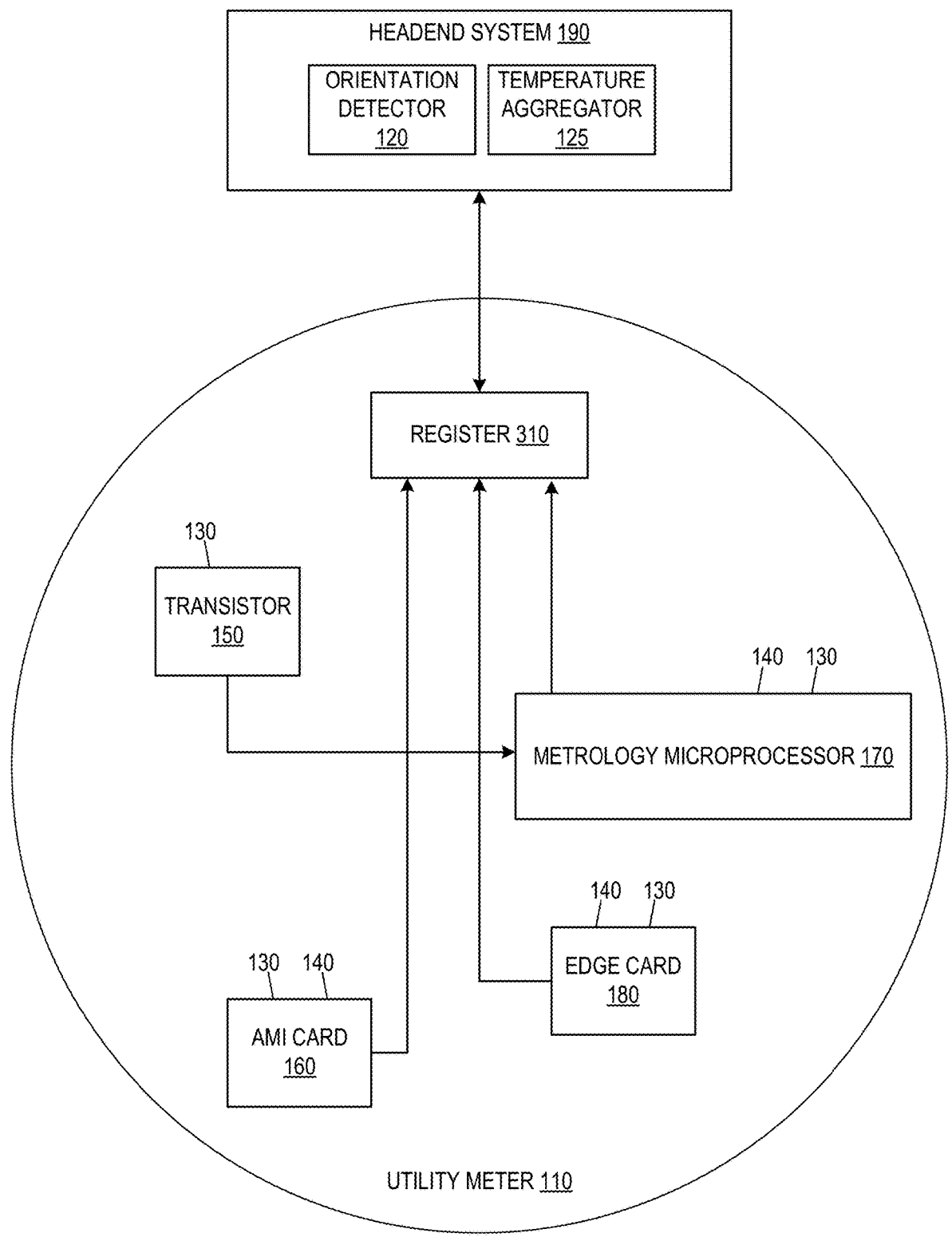
FIG. 3 is yet another diagram of a detection system for determining the orientation of a utility meter, according to some implementations described herein.

FIG. 3 is yet another diagram of the detection system 100 for determining the orientation of a utility meter 110, according to some implementations described herein. In the example of FIG. 3, both the orientation detector 120 and the temperature aggregator 125 are located remotely from the utility meter 110. Specifically, for instance, the orientation detector 120 and the temperature aggregator 125 may reside in the headend system 190 as shown; in other words, the headend system 190 may perform the tasks of aggregating temperature data from temperature measurements taken at the meter 110 and of determining meter orientation based on the temperature data. In that case, the headend system 190 may act as a centralized processor that aggregates temperature measurements of various utility meters 110 and determines the orientation of various utility meters 110 that implement aspects described herein.

In some implementations, as in the example of FIG. 3, the utility meter 110 is configured to take a snapshot, or a load profile, of various information related to the utility meter 110 at a given time for the snapshot. For instance, the snapshot can describe energy, voltage, current, power factor, temperature, or other information related to the meter 110. The utility meter 110 may take such a snapshot one or more times, e.g., periodically, and may store that snapshot in a register 310, such as a load profile register. The utility meter 110 may transmit data stored in the register 310 to the headend system 190, such as periodically, and as such, the headend system 190 may receive the various temperature measurements taken by the temperature sensors 130 of the detection system 100.

In some embodiments, at the headend system 190, the temperature aggregator 125 determines temperature data by aggregating temperature measurements from the various temperature sensors 130. The orientation detector 120 at the headend system 190 may then determine the meter orientation based on the temperature data. If the orientation detector 120 determines that meter orientation is incorrect, the headend system 190 may generate an alert for the utility service provider.

In some implementations, detecting meter orientation may include three stages: an installation stage, an initialization stage, and a detection stage. Generally, in the installation stage, software or hardware may be installed in the utility meter 110 to enable the utility meter to implement aspects of the detection system 100 as described herein; in the initialization stage, the detection system 100 may determine a thermal fingerprint of the utility meter 110 to use as a baseline that indicates the utility meter 110 is right-side up; and in the detection stage, the detection system 100 may determine a temperature gradient of the utility meter and compare that temperature gradient to the thermal fingerprint to determine an orientation of the utility meter 110. These stages are described in detail below.

Figure 4:
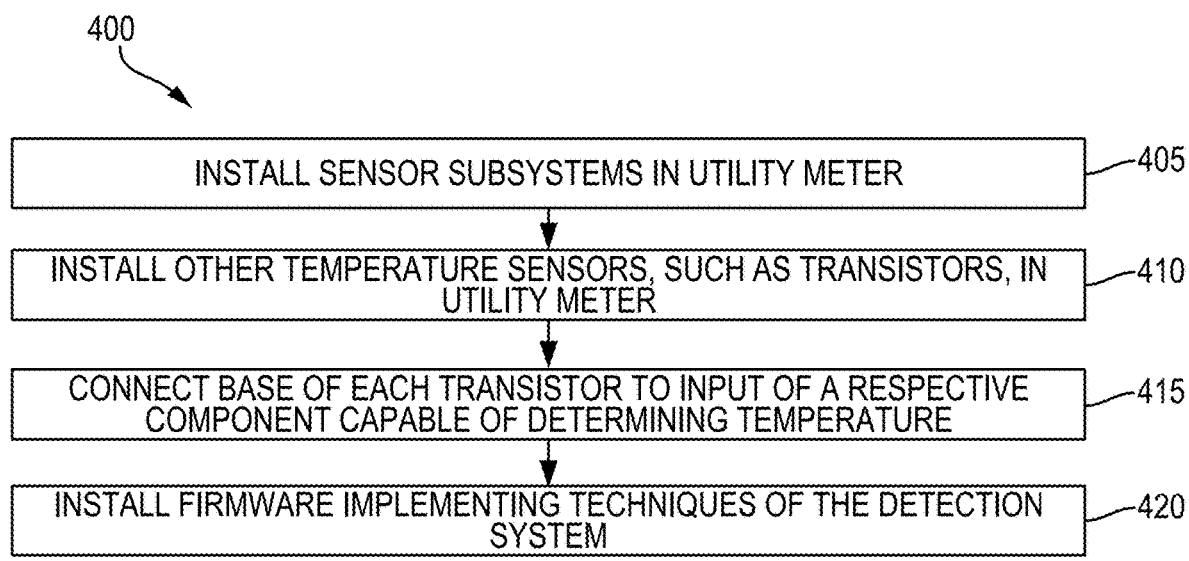
FIG. 4 is a diagram of a method of installing aspects of the detection system on the utility meter to enable detection of meter orientation, according to some implementations described herein.

FIG. 4 is a diagram of a method 400 of installing aspects of the detection system 100 on the utility meter 110 to enable detection of meter orientation, according to some implementations described herein. Specifically, this method 400 corresponds to the installation stage mentioned above. In some implementations, this method 400 may be performed in hardware, in software, by manual process, or by some combination of these and other mechanisms. For instance, some or all of this method 400 may be performed during manufacturing, during calibration, or during testing of the utility meter 110 and may be performed by manual work or by machinery, such as assembly line machinery.

As shown in FIG. 4, at block 405, one or more sensor subsystems 140 are installed in the meter 110. Specifically, the sensor subsystems 140 may be incorporated into a printed circuit board (PCB) of the meter 110 during manufacturing of the meter 110 or after fact, as in the case of a retrofit. As mentioned above, examples of the sensor subsystems 140 include an AMI card 160, a metrology microprocessor 170, and an edge card 180. In some implementations, the sensor subsystems 140 will act as temperature sensors 130 for the detection system 100.

At block 410, one or more other temperature sensors 130 are installed in the meter 110. For instance, one or more transistors 150 are installed as additional temperature sensors 130 to those installed at block 405. Each temperature sensor 130 may be installed on a PCB of the utility meter 110; for instance, a temperature sensor 130 may be installed at a location in the meter 100 that is not associated with a sensor subsystem 140 that can measure temperature at that location.

At block 415, for each transistor 150, the base of the transistor is connected to a sensor subsystem 140 or other component of the meter 110 that can detect an indication of temperature. For example, the base of the transistor 150 may be connected to an input of a sensor subsystem 140 that has an A/D convertor, such that the sensor subsystem 140 can detect an indication of temperature (e.g., current, voltage, or resistance) from the transistor 150 and can translate that indication into a temperature measurement. For instance, the sensor subsystem 140 to which a transistor 150 is connected may be the AMI card 160, the metrology microprocessor 170, or the edge card 180.

Figure 5:
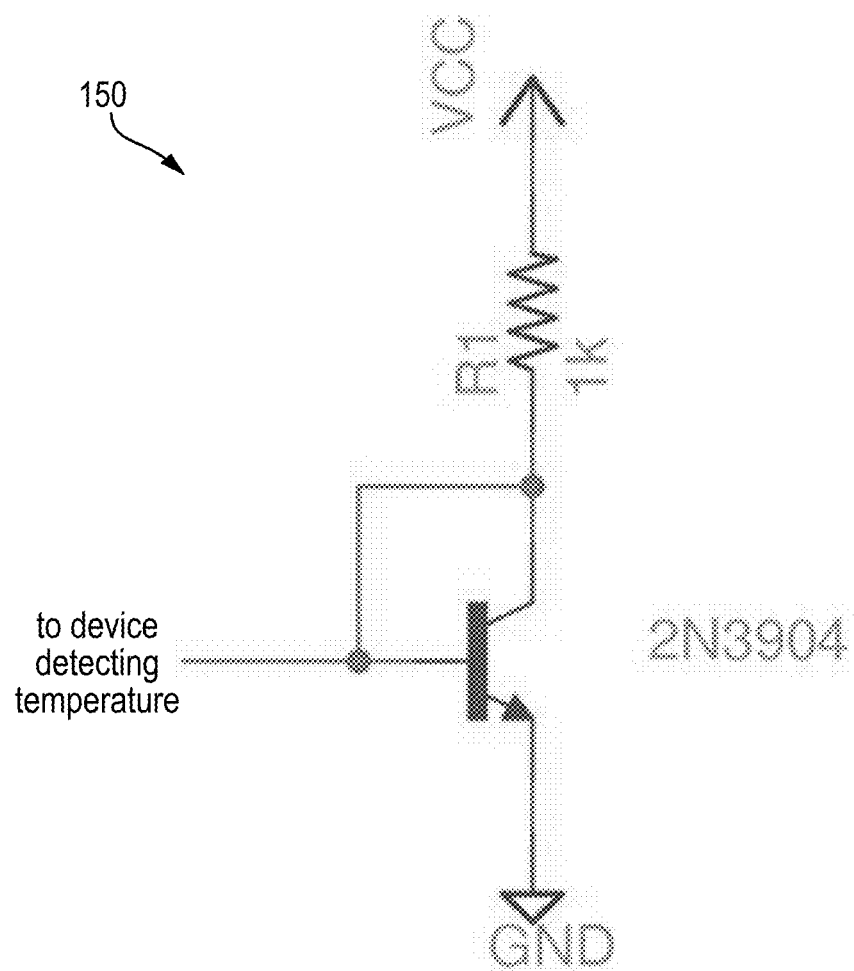
FIG. 5 is a diagram of a circuit that includes a transistor, which may be used in a temperature sensor for the detection system, according to some implementations described herein.

As an example, FIG. 5 is a diagram of a circuit 500 that includes a transistor 150, which may be used for a temperature sensor 130 in the detection system 100, according to some implementations described herein. As shown in FIG. 5, the transistor 150 may be an NPN transistor; however, a PNP transistor may additionally or alternatively be used. In some implementations, one or more transistors 150 are positioned strategically across the PCBs of the utility meter 110, specifically, at one or more regions of the utility meter 110 that lack respective sensor subsystems 140, to enable temperature measurements to be taken at various points throughout the utility meter 110.

In some implementations, two or more temperature sensors 130 are incorporated into the meter 110, and those two or more temperature sensors 130 may include sensor subsystems 140, transistors 150, other temperature sensors 130, or some combination thereof. For example, after the positions of the sensor subsystems 140 have been established, transistors 150 or other temperature sensors 130 may be installed at locations selected to ensure at least a vertical spatial distribution of temperature sensors 130. For instance, a utility meter 110 tends to run hot toward the top, potentially due to having hotter components toward the top or due to heat flow (i.e., because heat rises). Thus, the temperature sensors 130 can be arranged so as to measure at least two points for temperature, with one such point toward the top of the meter 110 and one such point toward the bottom of the meter 110.

Returning to FIG. 4, at block 420, firmware is installed on the meter to implement the techniques described herein. In one example, the firmware provides program code that instructs each of the temperature sensors 130 (e.g., each of the AMI card, the metrology microprocessor 170, the edge card 180, and each component that will determine temperature based on a transistor 150) to provide its respective temperature from time to time, such as periodically or on demand from the temperature aggregator 125, the orientation detector 120, or the headend system 190. Further, in some implementations, the firmware configures at least one of the sensor subsystems 140 or other components of the meter 110 to act as the temperature aggregator 125; for instance, the firmware provides code executable by a sensor subsystem 140 or other component to aggregate the temperature measurements into temperature data (e.g., temperature gradients associated with time) for use by the orientation detector 120. Additionally or alternatively, the firmware configures at least one of the sensor subsystems 140 or other components of the meter 110 to act as the orientation detector 120; for instance, the firmware provides code executable by a sensor subsystem 140 or other component to determine the meter orientation based on the temperature data.

In some implementations, various subsystems of the meter 110 used for other operations of the meter 110 may be included in the meter 110 regardless of whether the meter 100 implements aspects of the detection system 100. As such, the firmware to implement the detection system 100 may be installed on the meter 110 during manufacturing or, for instance, as a firmware update after deployment of the meter 110. In other words, a meter 110 may be updated to implement the detection system 100 once already operating in the field.

Figure 6:
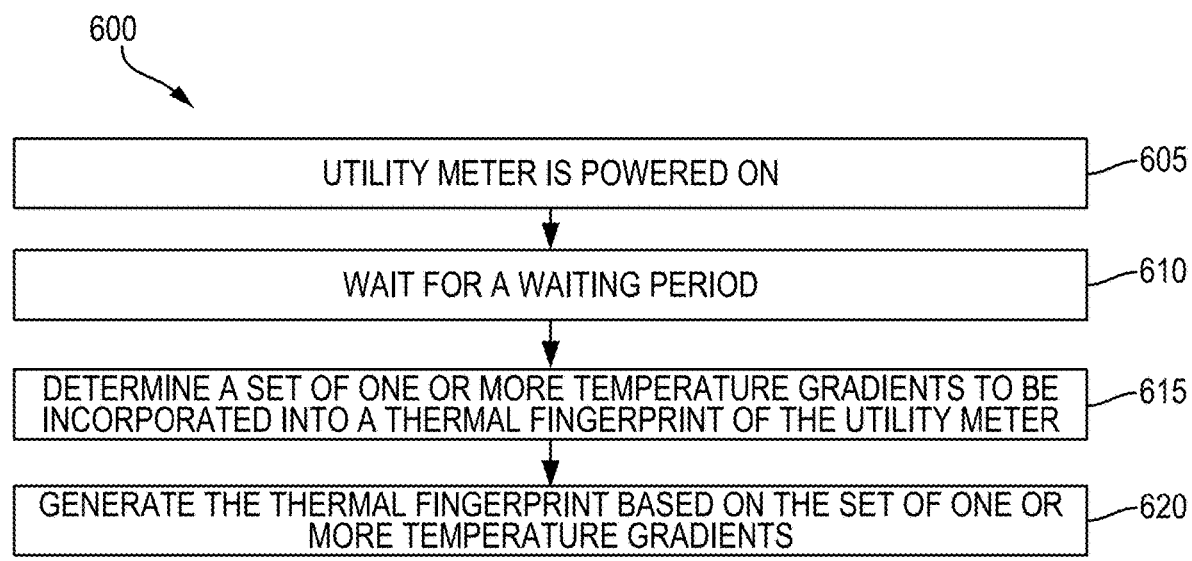
FIG. 6 is a diagram of a method of initializing the detection of meter orientation of the utility meter, according to some implementations described herein.

FIG. 6 is a diagram of a method 600 of initializing orientation detection in the utility meter 110, according to some implementations described herein. Specifically, this method 600 corresponds to the initialization stage mentioned above. In some implementations, this method 600 may be performed in hardware, software, or a combination of both. For instance, the method 600 may be performed by a specialized hardware circuit, may be embodied in program code executed by a processing unit, or a combination of both.

In some implementations, the detection system 100 determines a thermal fingerprint, or thermal profile, of the utility meter 110. Generally, the thermal fingerprint may be a baseline that describes temperature gradients expected for the meter 110 in a correct orientation (e.g., right-side up). In some implementations, the thermal fingerprint is a temperature gradient, or a set of temperature measurements, with each temperature measurement in the temperature gradient representing a baseline for a respective temperature sensor 130. Additionally or alternatively, in some implementations, the thermal fingerprint incorporates a time component, such that the thermal fingerprint represents how the temperature gradient can change over time (e.g., throughout the day). For instance, the thermal fingerprint can be a set of one or more curves that represents the change across temperature gradients while the meter 110 is right-side up. After the initialization stage, the detection system 100 may compare temperature data to the thermal fingerprint to determine whether the meter remains in a correct orientation.

The detection system 100 may use this method 600 or similar to determine the thermal fingerprint and thereby initialize the detection system 100 for the meter 110. In some implementations, the detection system 100 performs this method 600 or similar to initialize the detection system 100 from time to time to account for changes in the thermal fingerprint of the meter 110. Such changes may occur, for example, based on seasonal changes to the weather or based on wear of the internal parts of the meter 110, which may cause such internal parts to run hot. For instance, the detection system 100 may perform this method 600 or similar periodically, such as once per month, or on demand in response to a request from the headend system 190.

As shown in FIG. 6, at block 605, the meter 110 is powered on. For instance, this may be the first time the meter 110 is powered on after deployment of the meter 110, or this may be a powering on after the meter 110 was powered off, such as during part of a troubleshooting or upgrade process.

At block 610, after the meter 110 powers on, the detection system 100 waits for a waiting period before determining a thermal fingerprint of the meter 110. In some implementations, it may take some time after power-on for the meter 110 to reach an equilibrium thermal state. For instance, after a device has been powered off for some time, its temperature is likely to drop, and after power on, it may take some time for the temperature to rise before plateauing at an equilibrium thermal state. Similarly, this may be the case with a utility meter 110, and thus, the waiting period can help ensure that the thermal fingerprint accurately represents the meter 110 in operation.

The waiting period may be of various time lengths. In some implementations, testing may be performed in advance, such as by a manufacturer or server provider of the meter 110, to determine a time length until thermal equilibrium is typically reached, and the waiting period can be set to that time length or to a time length sufficiently longer than that time length. For example, the waiting period may be approximately fifteen minutes.

At block 615, after the waiting period of block 610 expires, the detection system 100 determines a set of temperature gradients to be incorporated into the thermal fingerprint. The set of temperature gradients may include one or more temperature gradients. Each such temperature gradient may be timestamped (i.e., associated with a time). For instance, a temperature gradient is represented as a set of coordinates, or a vector, having a number of dimensions equal to the number of temperature sensors 130 being used in the utility meter 110 for the detection system 100. To determine a temperature gradient, an implementation of the detection system 100 requests that the various temperature sensors 130 take a respective temperature measurement at a given time, and the temperature measurements may be stored as the temperature gradient (e.g., as a set of coordinates) associated with the given time. The coordinates and associated time may be stored in various ways, such as in a set of numbers in a text file, in a database table, or in a data structure in memory.

In some implementations, the detection system 100 determines one or more of such temperature gradients after the waiting period, and those one or more temperature gradients are included in the set of temperature gradients used for the thermal fingerprint. In one example, in which only a single temperature gradient is used, the detection system 100 may determine that single temperature gradient after the waiting period. In another example, over the first three days after the waiting period, the detection system 100 may determine a temperature gradient every hour on the hour. Thus, in this example, the set of temperature gradients includes seventy-two temperature gradients determined over seventy-hours, with each temperature gradient being associated with a time, and with the times of the temperature gradients being spaced an hour apart. By spreading the temperature gradients across at least a full day, some implementations can ensure that the thermal fingerprint represents the changing temperatures of the meter 110 throughout varying temperatures of a full day; however, it will be understood that this is not required.

At block 620, the detection system 100 generates a thermal fingerprint based on the set of temperature gradients. The thermal fingerprint can take various forms. In some implementations, the thermal fingerprint represents the changing temperature gradient of the utility meter 110 over time, such as through a curve or an aggregate.

In one example, the thermal fingerprint is or includes a single temperature gradient determined, which may be a set of temperature measurements representing a respective temperature measurement for each temperature sensor 130. The temperature gradient may be a set of temperature measurements taken at a given time, or the temperature gradient may be an aggregate, or representation, of multiple temperature gradients determined at block 615. For instance, the temperature gradient used as the thermal fingerprint may include a set of temperatures, each of which is the respective average temperature for a temperature sensor 130 represented in the temperature gradients determined at block 615.

In another example, the thermal fingerprint may be one or more curves. In one example, the thermal fingerprint is a single curve (e.g., a multidimensional curve) describing the set of temperature gradients determined at block 615. Thus, the detection system 100 may fit a curve to the set of temperature gradients, where each temperature gradient is a point described by a set of coordinates, or a vector, used a basis for fitting the curve. In another example, the thermal fingerprint is a set of curves, such as a set of one-dimensional curves, with each curve corresponding to a particular temperature sensor 130 and mapping time to a temperature measurement of that temperature sensor 130. Various techniques exist for fitting one-dimensional or multidimensional curves, and the detection system 100 may use one or more of such techniques to compute the thermal fingerprint.

In some implementations, if the thermal fingerprint is represented as one or more curves, the thermal fingerprint has a range. The range may be defined by an error threshold corresponding to each curve in the thermal fingerprint for instance. An error threshold may be based on settings of the detection system 100, where those settings may be configurable by the utility service provider. In some implementations, a temperature gradient determined during the detection stage, as described below, will be considered to fall outside the thermal signature only if a point at coordinates representing that temperature gradient has a distance from an applicable curve of the thermal fingerprint that exceeds the error threshold for that curve.

In some implementations, determining the thermal fingerprint (e.g., aggregating one or more temperature gradients or fitting one or more curves to a set of temperature gradients) may be performed locally at the meter 110 or may be performed remotely. For instance, the orientation detector 120 may determine the thermal fingerprint. In that case, if the orientation detector 120 resides on the meter 110, then the meter 110 may determine the thermal fingerprint, and if the orientation detector resides on the headend system 190, then the meter 110 may transmit the set of temperature gradients to the headend system 190, which may determine the thermal fingerprint. Additionally or alternatively, even if the orientation detector 120 resides on the meter 110, the meter 110 may transmit the set of temperature gradients to the headend system 190, or to some other remote processor, for determination of the thermal fingerprint. In that case, the headend system 190, or other remote processor, may transmit the thermal fingerprint back to the meter 110 for use by the orientation detector 120.

Figure 7:
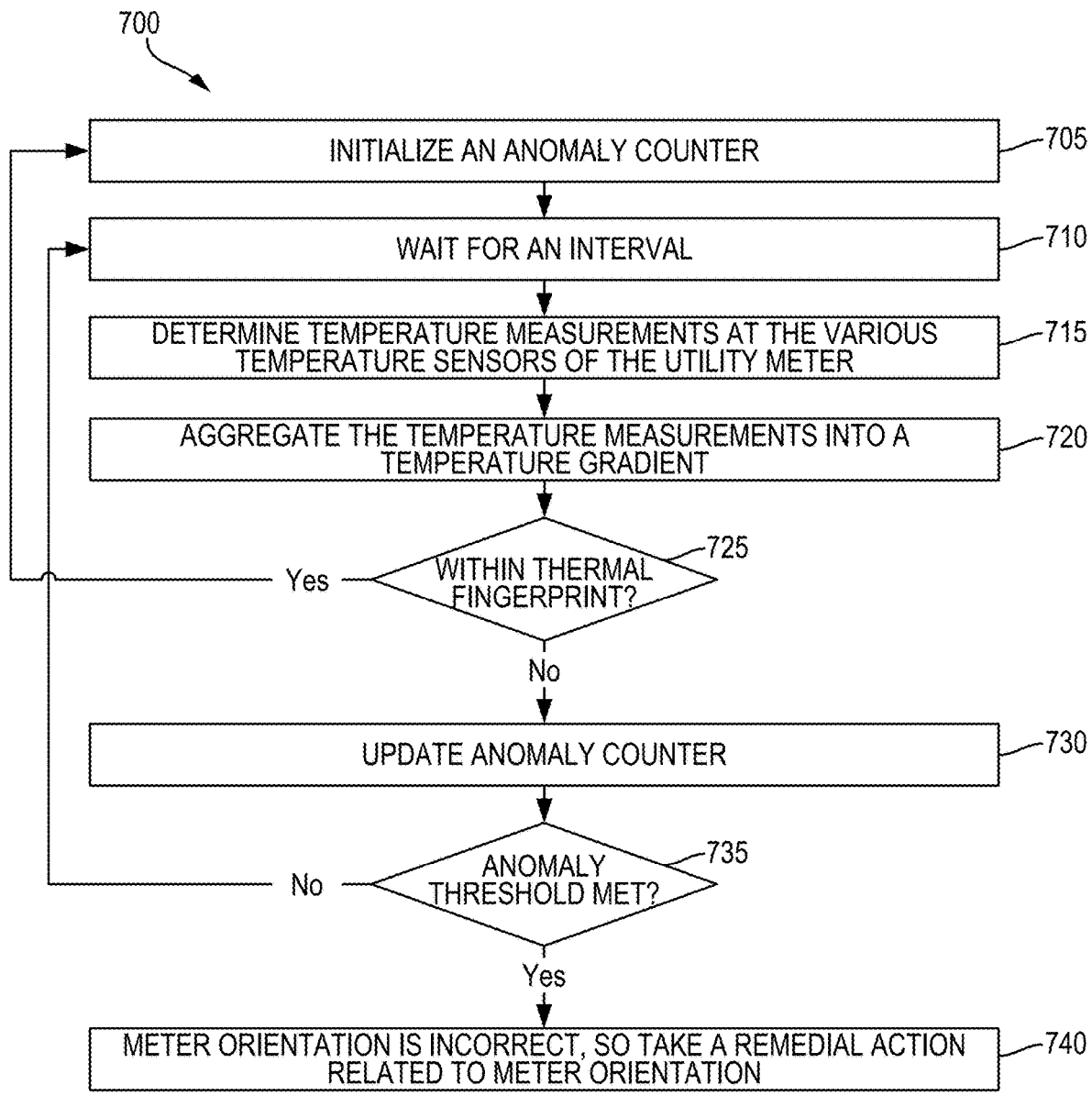
FIG. 7 is a diagram of a method for detecting meter orientation of the utility meter based on a thermal fingerprint of the utility meter, according to some implementations described herein.

FIG. 7 is a diagram of a method 700 for detecting meter orientation based on the thermal fingerprint of the meter 110, according to some implementations described herein. Specifically, this method 700 corresponds to the detection stage mentioned above and may be performed after the initialization stage (e.g., after the method 600 of FIG. 6). In some implementations, this method 700 may be performed in hardware, software, or a combination of both. For instance, the method 700 may be performed by a specialized hardware circuit, may be embodied in program code executed by a processing unit, or a combination of both.

As shown in FIG. 7, at block 705, the detection system 100 initializes an anomaly counter. For instance, the orientation detector 120 maintains and initializes the anomaly counter by setting the anomaly counter, which can be an integer variable, to a value of zero or to the value of an anomaly threshold that represents the maximum number of allowed anomalies before the detection system 100 deems the meter orientation to be incorrect. The anomaly threshold may be a default anomaly threshold or may be configurable by the utility service provider, for instance. The anomaly counter can count upward to the anomaly threshold or downward from the anomaly threshold, for instance. It will be understood that various implementations of the anomaly counter are possible and are within the scope of this disclosure.

In some implementations, the anomaly counter represents the number of sequential times that the temperature gradient of the meter 110 has fallen outside of the thermal fingerprint; for instance, the anomaly counter has a value equal to that number or has a value equal to the anomaly threshold less that number. The anomaly counter may be used to allow some variation in the thermal fingerprint without drawing the conclusion that the meter orientation is incorrect. For instance, if a heat source is temporarily placed near the meter 110, causing short-term heat in a region of the meter 110, one or more temperature gradients may fall outside the thermal fingerprint even though the meter 110 is not necessarily in an incorrect orientation. Use of an anomaly counter essentially leaves room for such a situation to occur without raising an alert. However, some implementations do not use an anomaly counter, in which case any deviation of the temperature gradient from the thermal fingerprint may result in a notification of incorrect meter orientation.

At block 710, the detection system 100 waits for an interval. Waiting for an interval may enable the detection system 100 to space out determinations of temperature gradients over time. For instance, the detection system 100 may determine temperature gradients periodically, such as once per hour or once per day, in which case the interval may be an hour or a day respectively. Additionally or alternatively, in some implementations, the headend system 190 may determine when the interval ends, such that the detection system 100 waits until receiving from the headend system 190 a request to determine a temperature gradient for determining meter orientation. Thus, the detection system 100 may determine meter orientation on demand rather than, or additionally to, determining meter orientation periodically.

At block 715, the detection system 100 measures the temperature of the meter 110 at the various temperature sensors 130 at a measurement time. In some implementations, each temperature sensor 130 provides a respective temperature measurement that corresponds to the measurement time. To this end, for example, when the interval of block 710 ends, the temperature aggregator 125 sends to each temperature sensor 130 a request for a respective temperature measurement; in that case, the request can indicate a measurement time, for instance, where the measurement time is indicated in the contents of the request or in a timestamp as metadata of the request. The temperature sensor 130 may then provide to the temperature aggregator 125 a temperature measurement taken at the measurement time. In another example, a temperature sensor 130 detects that the interval of block 710 has ended and, responsive to the end of the interval, provides a temperature measurement taken at the time the interval ends, which is the measurement time in that case.

In some implementations, a temperature sensor 130 measures temperature regularly (e.g., continuously) regardless of the detection system 100. For instance, in the case of a sensor subsystem 140, the sensor subsystem 140 may measure its internal temperature using its built-in internal temperature-sensing capability. In the case of a transistor 150, a sensor subsystem 140 or other component may detect an indication of temperature, such as the current, voltage, or resistance at the base of the transistor 150, and may determine a temperature measurement at the transistor 150 based on that indication. In that case, the sensor subsystem 140 or other component that detects the indication may provide the temperature measurement to the temperature aggregator 125. Thus, a temperature sensor 130 need not measure the temperature on demand for the detection system 100. Rather, upon determining that a temperature measurement is needed (e.g., based on a request from the temperature aggregator 125 or based on the interval coming to an end), the temperature sensor 130 may provide a temperature measurement that corresponds to the measurement time. Thus, each temperature sensor 130 may provide a temperature measurement at its respective point on the meter 110 and at a common time.

At block 720, the temperature aggregator 125 aggregates the temperature measurements of the various temperature sensors 130 to form temperature data. For instance, each temperature sensor 130 may send its temperature measurement to the temperature aggregator 125, which may store the combined temperature measurements as temperature data. The temperature data may include a current temperature gradient that corresponds to the measurement time, where the current temperature gradient may be represented as a set of coordinates corresponding to the temperature measurements.

At decision block 725, the detection system 100 determines whether the current temperature gradient generated at block 720 falls within the thermal fingerprint of the meter 110 as determined during the initialization stage. Specifically, in some implementations, this determination may be made by the orientation detector 120, which may reside at the meter 110 itself, as in the example of FIG. 1, or at the headend system 190, as in the example of FIG. 2. In the former case, the determination of whether the current temperature gradient falls within the thermal fingerprint may be made by the AMI card 160, the metrology microprocessor 170, the edge card 180, or by some other component of the meter 110. However, if the orientation detector 120 is located at the headend system 190, then the meter 110 transmits the current temperature gradient to the headend system 190 for analysis. Determining whether the current temperature gradient falls within the thermal fingerprint may be performed in various ways, dependent on how the thermal fingerprint is represented.

In one example, as discussed above, the thermal fingerprint is or includes a temperature gradient, which may be an aggregate of a set of temperature gradients. In that case, determining whether the current temperature gradient, as generated at block 720, falls within the thermal fingerprint may involve determining whether the relationships between temperature measurements of the temperature sensors 130 in the current temperature gradient are consistent with the relationships between temperatures in the thermal fingerprint. For instance, the detection system 100 may determine that the current temperature gradient does not fall within the thermal fingerprint if one or more of the following is true: (a) the temperature sensor 130 with the highest temperature in the thermal fingerprint now has the lowest temperature measurement, (b) the temperature sensor 130 with the highest temperature in the thermal fingerprint no longer has the highest temperature measurement, (c) the temperature sensor 130 with the lowest temperature in the thermal fingerprint now has the highest temperature measurement, (d) the temperature sensor 130 with the lowest temperature in the thermal fingerprint no longer has the lowest temperature measurement, or (e) a computed error representing the change in the differences between temperature measurements in the current temperature gradient as compared to the differences between temperatures in the thermal fingerprint falls outside an acceptable error range.

In some implementations, absolute changes in temperature measurements are expected due to changing weather conditions or other environmental conditions. However, a relative change among the temperature measurements of the temperature sensors 130 may be deemed an indication that the meter orientation is incorrect. The example of FIG. 8 and FIG. 9 below demonstrates this.

Figure 8:
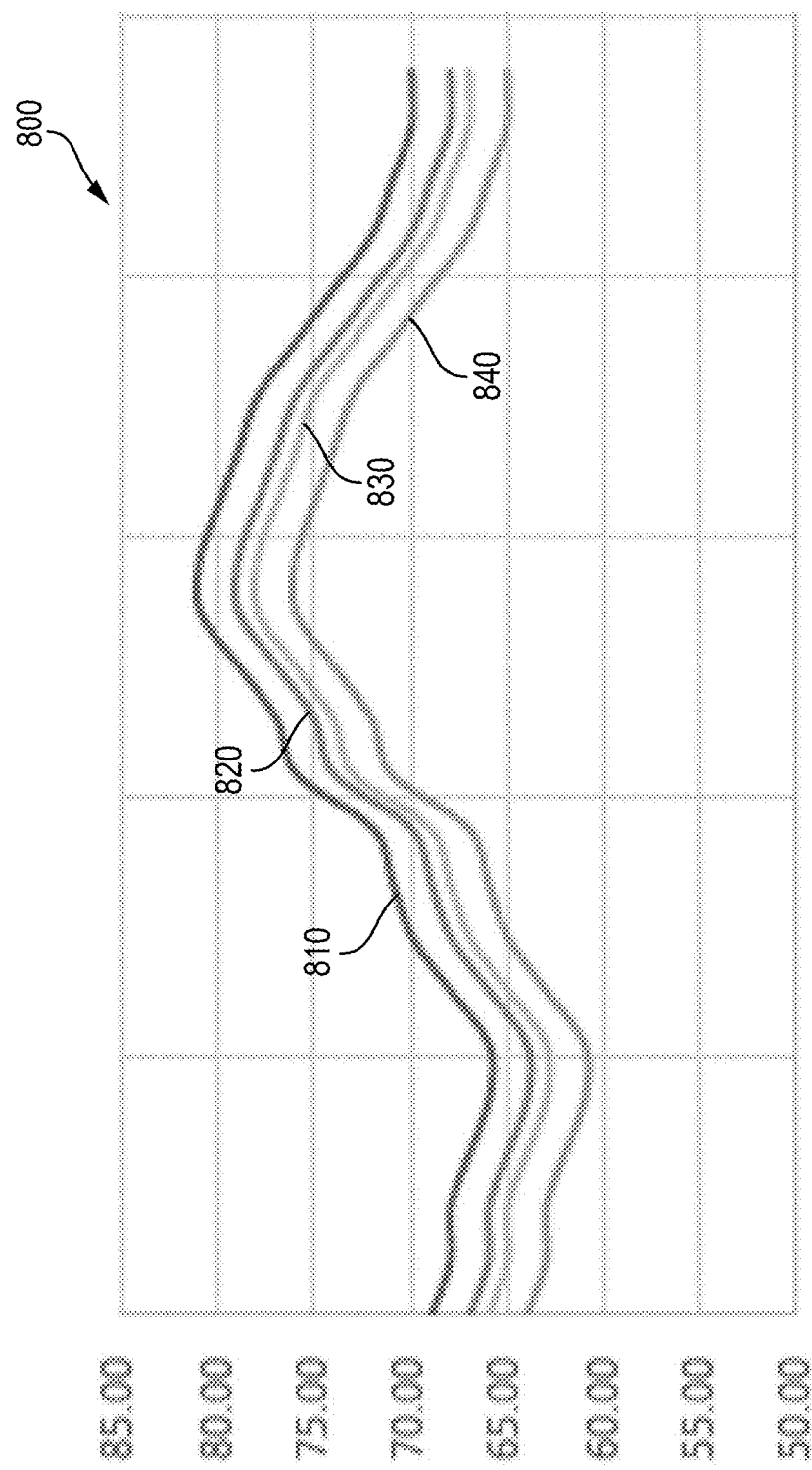
FIG. 8 illustrates a graph of temperature measurements taken over time by temperature sensors in an example of the detection system, when a utility meter is right-side up, according to some implementations described herein.

FIG. 8 illustrates a first graph 800 of temperature measurements taken over time by temperature sensors 130 in an example of the detection system 100, according to some implementations described herein. Specifically, the x-axis represents time for the span of almost one day, and the y-axis represents temperature in Fahrenheit. Specifically, the first graph 800 includes a first curve 810 representing temperature measurements taken by a first temperature sensor 130, a second curve 820 representing temperature measurements taken by a second temperature sensor 130, a third curve 830 representing temperature measurements taken by a third temperature sensor 130, and a fourth curve 840 representing temperature measurements taken by a fourth temperature sensor 130. Thus, each time on the x-axis corresponds to a temperature gradient including the temperature measurements taken by the four temperature sensors 130 in this example.

As shown in FIG. 8, the temperature measurements of the four temperature sensors 130 represented by the four curves in the first graph 800 are approximately consistent relative to one another over time. This indicates that, although the absolute temperatures may change over time, one can expect the difference between a selected two of such curves not to change by much. However, if the meter 110 is turned upside-down, then the temperature measurements are likely to change relative to one another.

Figure 9:
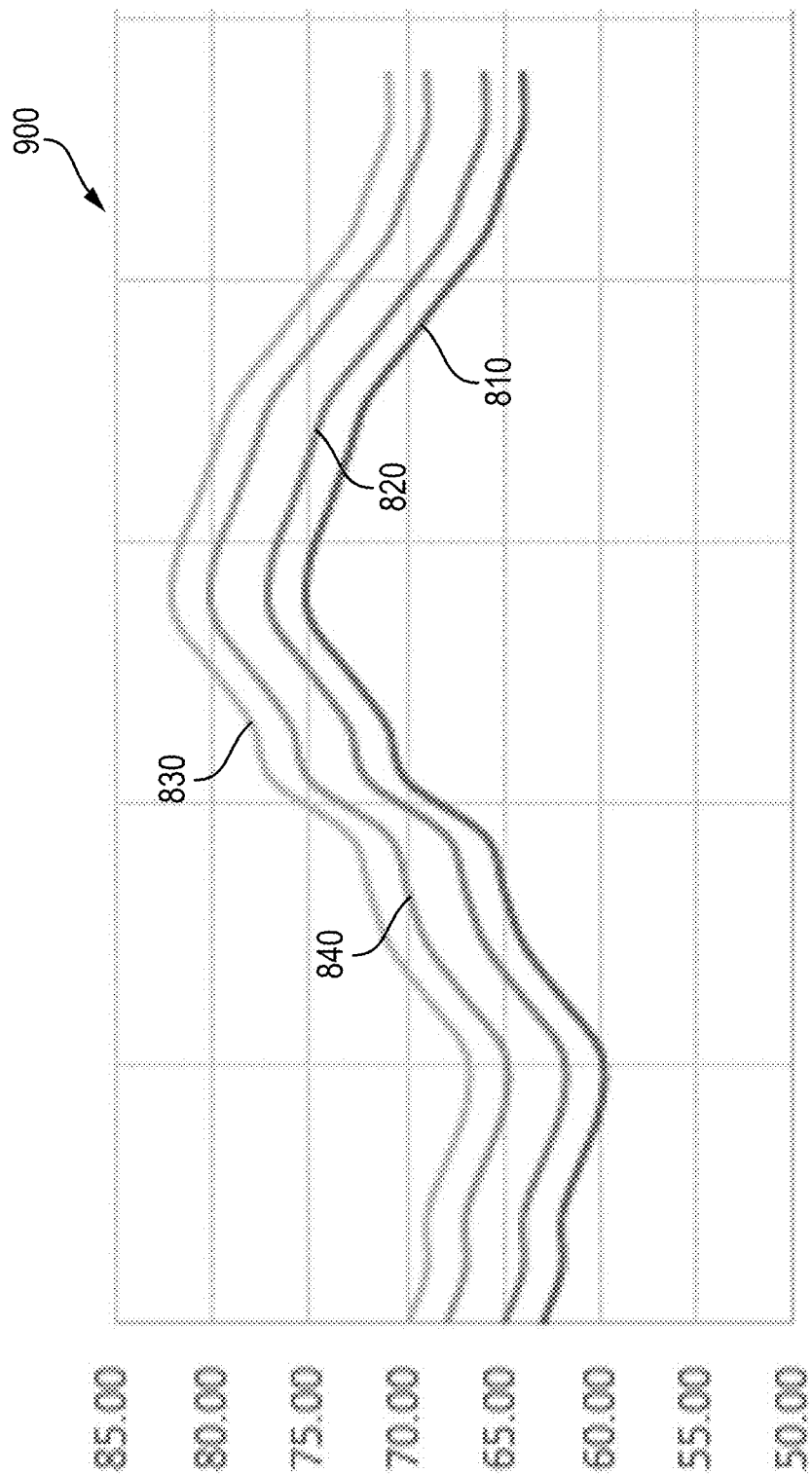
FIG. 9 illustrates another graph of temperature measurements taken over time by the temperature sensors in the example of the detection system represented in FIG. 8, when the utility meter is upside-down, according to some implementations described herein.

FIG. 9 illustrates a second graph 900 of temperature measurements taken over time by the same temperature sensors 130 in the example of the detection system 100 represented in the first graph 800, according to some implementations described herein. Similar to the first graph 800, this second graph 900 has the x-axis representing time for the span of almost one day and the y-axis representing temperature in Fahrenheit. Specifically, the second graph 900 illustrates how the first curve 810 representing the first temperature sensor 130, the second curve 820 representing the second temperature sensor 130, the third curve 830 representing the third temperature sensor 130, and the fourth curve 840 representing the fourth temperature sensor 130 have changed due to the meter 110 being turned upside-down.

For instance, as demonstrated by the first graph 800 of FIG. 8, when the meter 100 is right-side up, the first temperature sensor 130 consistently takes the highest temperature measurements, and this may be due to the first temperature sensor 130 being located higher on the meter 110 than the other temperature sensors 130 when the meter 110 is right-side up. However, as demonstrated by the second graph 900 of FIG. 9, turning the meter upside-down causes the first temperature sensor 130, represented by the first curve 810, to return the lowest temperature measurements. In some implementations, this dramatic change in relative temperatures indicates that the meter orientation is incorrect, specifically, upside-down.

Returning to decision block 725 of FIG. 7, in another example of determining whether the current temperature gradient generated at block 720 falls within the thermal fingerprint of the meter 110, the thermal fingerprint is one or more curves representing time of day versus a set of temperature variables corresponding to the temperature sensors 130 being used by the detection system. In that case, the thermal fingerprint may be a single multidimensional curve or a set of one-dimensional curves, for instance. Each curve of the thermal fingerprint may be associated with an error threshold representing a range of the thermal fingerprint in the applicable dimensions. For each such curve, the detection system 100 may determine whether a point representing the current temperature gradient (i.e., representing the coordinates of the current temperature gradient) is within a distance that does not exceed the error threshold associated with that curve. If the detection system 100 determines that the point representing the current temperature gradient falls outside the respective error threshold for at least one curve of the thermal fingerprint, then the detection system 100 may decide that the current temperature gradient falls outside the thermal fingerprint. However, if the detection system 100 determines that the coordinates of the current temperature gradient fall inside the respective error threshold for each curve of the thermal fingerprint, then the detection system 100 may decide that the current temperature gradient is within the thermal fingerprint.

If the current temperature gradient is deemed to fall within the thermal fingerprint at decision block 725, the method 700 returns to block 705, where the anomaly counter is initialized and the detection system 100 waits for an interval before determining another temperature gradient. However, if the temperature gradient is deemed to fall outside the thermal fingerprint, then the method 700 proceeds to block 730.

At block 730, the detection system 100 updates the anomaly counter. Updating the anomaly counter can include incrementing the anomaly counter by one in the case where the anomaly counter indicates the number of anomalies (i.e., the number of times the temperature gradient fell outside the thermal fingerprint) since the last time a temperature gradient was deemed normal (i.e., within the thermal fingerprint) or, if the anomaly counter is counting downward from the anomaly threshold, can instead include decrementing by one the anomaly counter. In some implementations, the orientation detector 120 maintains the anomaly counter, and thus the orientation detector 120 increments, or decrements, the anomaly counter.

At decision block 735, the detection system 100 determines whether the number of sequential anomalies meets (e.g., equals or exceeds) an anomaly threshold. For instance, if the anomaly counter is counting upward, then the anomaly threshold may be deemed met when the value of the anomaly counter meets or when the value of the anomaly counter exceeds the anomaly threshold, depending on implementation. If the anomaly counter is counting downward, then the anomaly threshold may be deemed met when the value of the anomaly counter reaches zero or when the value of the anomaly counter falls below zero, depending on implementation.

If the number of sequential anomalies does not meet the anomaly threshold, then the method 700 returns to block 710, where the detection system 100 waits for an interval before determining another temperature gradient. However, if the number of sequential anomalies meets the anomaly threshold, then the method 700 proceeds to block 740.

In some implementations, the detection system 100 deems the meter 110 to have an incorrect orientation every time the temperature gradient falls outside the thermal fingerprint. In such implementations, for instance, either the anomaly threshold is set to zero or no anomaly counter or anomaly threshold need be used. In that case, if the temperature gradient is deemed to fall outside the thermal fingerprint at decision block 725, then the method 700 may continue at block 740.

At block 740, the detection system 100 deems the meter 110 to have an incorrect orientation or, more specifically, deems the meter 110 to be upside-down, and as such, the detection system 100 takes a remedial action regarding the meter orientation. For instance, the remedial action may be to notify the headend system 190 or to unilaterally and automatically disconnect utility services associated with the meter 110. Various remedial actions are possible and within the scope of this disclosure.

Figure 10:
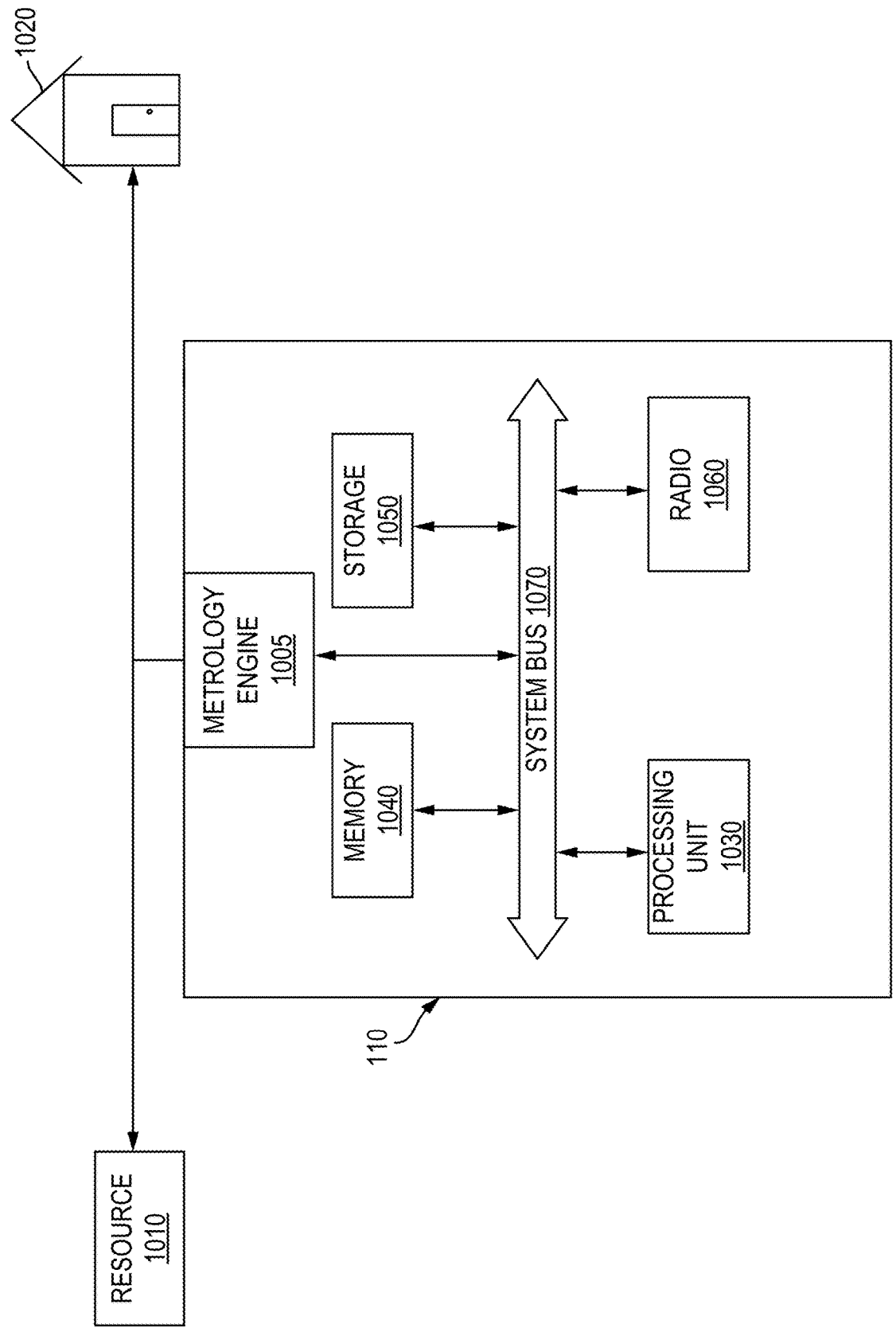
FIG. 10 is a diagram of an architecture of the utility meter, according to some implementations described herein.

FIG. 10 is a diagram of an architecture of an example utility meter 110, according to some implementations described herein. For instance, the utility meter 110 may be an electricity meter or another type of meter that measures consumption of a resource 1010. A utility meter 110 such as that shown may implement aspects of a detection system 100 to determine an orientation of the utility meter 110. However, although this disclosure refers to the detection system 100 being incorporated into a utility meter 110, implementations described herein are not limited to that context. For instance, the detection system 100 may be embodied in another type of device, other than a utility meter 110, that requires a specific orientation or set of orientations for proper operation.

As shown in FIG. 10, an example utility meter 110 measures consumption of a resource 1010 occurring on a premises 1020. To this end, the utility meter 110 may include a metrology engine 1005, which detects a signal indicating use of the resource 1010 and, based on that signal, determines use of the resource 1010 on the premises 1020. The metrology engine 1005 may be or include the metrology microprocessor 170 and may thus act as a sensor subsystem 140 in some implementations of the detection system 100. The utility meter 110 may further include a processing unit 1030, a volatile memory 1040, a nonvolatile storage 1050, and a communication device such as a radio 1060. For instance, the utility meter 110 may use the radio 1060 to transmit temperature data or an indication of incorrect meter orientation to the headend system 190. In some implementations, the radio 1060 is the AMI card 160 or is included on the AMI card 160. The processing unit 1030, the volatile memory 1040, the nonvolatile storage 1050, and the radio 1060 may be in communication with one another and with the metrology engine 1005 by way of a system bus 1070.

Although the processing unit 1030, the volatile memory 1040, and the nonvolatile storage 1050 are shown and described herein as being distinct components, it will be understood that this distinction is for illustrative purposes only and does not limit the scope of this disclosure. For instance, the processing unit 1030, the volatile memory 1040, and the nonvolatile storage 1050 may be integrated together into a single chip, such as a microcontroller unit.

In some implementations, operations of detection system 100 described herein, such as determining a thermal fingerprint, measuring temperature, determining a temperature gradient, or comparing the temperature gradient to the thermal fingerprint, are embodied as program instructions stored in a computer-readable medium, such as the nonvolatile storage 1040 or the volatile memory 1050 of the utility meter 110. In some implementations, the computer-readable medium is a non-transitory computer-readable medium. The processing unit 1030 may execute the program instructions to implement operations of the detection system 100 as described herein.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. For instance, a computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus, such as a utility meter 110, implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for detecting a meter orientation, the method comprising:
    determining a set of temperature measurements comprising a respective temperature measurement at two or more temperature sensors of a utility meter;
    comparing the set of temperature measurements to a thermal fingerprint of the utility meter, wherein the thermal fingerprint represents a baseline set of one or more temperature gradients based on the two or more temperature sensors over time;
    detecting that an orientation of the utility meter is incorrect, based on comparing the set of temperature measurements to the thermal fingerprint of the utility meter; and
    performing a remedial action based on the orientation of the utility meter being incorrect.

2. The method of claim 1, wherein a first temperature sensor of the two or more temperature sensors is at least one of an Advanced Metering Infrastructure (AMI) card, a metrology microprocessor, or an edge card of the utility meter.

3. The method of claim 1, wherein a first temperature sensor of the two or more temperature sensors comprises a transistor.

4. The method of claim 3, wherein at least one of an AMI card, a metrology microprocessor, or an edge card of the utility meter detects an indication of temperature at a base of the transistor to determine the respective temperature measurement at the transistor.

5. The method of claim 1, further comprising determining the thermal fingerprint of the utility meter, wherein determining the thermal fingerprint of the utility meter comprises:
    determining a set of one or more temperature gradients of the utility meter, each temperature gradient of the set of temperature gradients being associated with a corresponding time.

6. The method of claim 5, wherein:
    the set of one or more temperature gradients comprises at least two temperature gradients; and
    determining the thermal fingerprint of the utility meter further comprises fitting a curve to the at least two temperature gradients.

7. The method of claim 5, wherein determining the thermal fingerprint of the utility meter comprises aggregating the set of one or more temperature gradients.

8. The method of claim 1, wherein detecting that the orientation of the utility meter is incorrect, based on comparing the set of temperature measurements to the thermal fingerprint of the utility meter, comprises detecting a change in a relationship among temperatures in the thermal fingerprint.

9. The method of claim 8, wherein detecting the change in the relationship among temperatures in the thermal fingerprint comprises detecting that, in the set of temperature measurements, a first temperature measurement taken by a first temperature sensor of the two or more temperature sensors is higher than a second temperature measurement taken by a second temperature sensor of the two or more temperature sensors and, in the thermal fingerprint, a first temperature corresponding to the first temperature sensor is lower than a second temperature corresponding to the second temperature sensor.

10. A detection system comprising:
    two or more temperature sensors incorporated into a utility meter, the two or more temperature sensors configured to determine a set of temperature measurements at the utility meter;
    a temperature aggregator configured to combine the set of temperature measurements into a temperature gradient; and
    an orientation detector configured to:
        compare the temperature gradient to a thermal fingerprint of the utility meter; and
        detect a change in orientation of the utility meter based on a change in a relationship among temperatures in the temperature gradient as compared to the thermal fingerprint,
        wherein the thermal fingerprint represents a baseline set of one or more temperature gradients based on the two or more temperature sensors over time.

11. The detection system of claim 10, wherein the two or more temperature sensors comprise at least one of an Advanced Metering Infrastructure (AMI) card, a metrology microprocessor, or an edge card of the utility meter.

12. The detection system of claim 11, wherein the two or more temperature sensors comprise a transistor, and wherein at least one of the AMI card, the metrology microprocessor, or the edge card is configured to detect an indication of temperature at a base of the transistor to determine a respective temperature measurement for the transistor.

13. The detection system of claim 10, wherein the orientation detector is integrated with at least one of an AMI card, a metrology microprocessor, or an edge card of the utility meter.

14. The detection system of claim 13, wherein the orientation detector computes the thermal fingerprint of the utility meter based on a set of temperature gradients determined for the utility meter over a timeframe.

15. The detection system of claim 10, wherein the orientation detector is located in a headend system located remotely from the utility meter, and wherein the utility meter transmits the temperature gradient to the headend system to enable the headend system to determine the meter orientation of the meter.

16. The detection system of claim 10, wherein detecting a change in the orientation of the utility meter comprises detecting that the orientation of the utility meter is now incorrect, and wherein the detection system is further configured to perform a remedial action based on the orientation of the utility meter being incorrect.

17. A computer-program product for detecting a meter orientation, the computer-program product comprising a non-transitory computer-readable storage medium having program instructions embodied thereon, the program instructions executable by one or more processors to cause the one or more processors to perform a method comprising:

determining a set of temperature measurements comprising a respective temperature measurement at two or more temperature sensors of a utility meter;

comparing the set of temperature measurements to a thermal fingerprint of the utility meter, wherein the thermal fingerprint represents a baseline set of one or more temperature gradients based on the two or more temperature sensors over time;

detecting that an orientation of the utility meter is incorrect, based on comparing the set of temperature measurements to the thermal fingerprint of the utility meter; and performing a remedial action based on the orientation of the utility meter being incorrect.

18. The computer-program product of claim 17, the method further comprising determining the thermal fingerprint of the utility meter, wherein determining the thermal fingerprint of the utility meter comprises:

determining a set of one or more temperature gradients of the utility meter after a waiting period following startup of the utility meter.

19. The computer-program product of claim 18, the method further comprising determining the thermal fingerprint of the utility meter, wherein determining the thermal fingerprint of the utility meter comprises aggregating the set of one or more temperature gradients.

20. The computer-program product of claim 17, wherein detecting that the orientation of the utility meter is incorrect, based on comparing the set of temperature measurements to the thermal fingerprint of the utility meter, comprises detecting a change in a relationship among temperature measurements in the set of temperature measurements as compared to temperatures in the thermal fingerprint.

\* \* \* \* \*